United States Patent
Miesner

(10) Patent No.: US 11,302,862 B1
(45) Date of Patent: Apr. 12, 2022

(54) MAGNETOSTRICTIVE ACTUATOR WITH CENTER BIAS

(71) Applicant: The United States of America, as represented by the Secretary of the Navy, Arlington, VA (US)

(72) Inventor: John E. Miesner, Fairfax, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 17/171,317

(22) Filed: Feb. 9, 2021

Related U.S. Application Data

(62) Division of application No. 15/717,658, filed on Sep. 27, 2017, now Pat. No. 10,930,838.

(51) Int. Cl.
*H01L 41/12* (2006.01)
*H01L 41/06* (2006.01)
*H02N 2/04* (2006.01)

(52) U.S. Cl.
CPC .............. *H01L 41/12* (2013.01); *H01L 41/06* (2013.01); *H02N 2/043* (2013.01)

(58) Field of Classification Search
CPC .......... H01L 41/12; H01L 41/06; H02N 2/043
See application file for complete search history.

(56) References Cited

U.S. PATENT DOCUMENTS

| 6,037,682 | A * | 3/2000 | Shoop | H01L 41/12 310/26 |
| 7,675,253 | B2 * | 3/2010 | Dorel | E21B 41/00 318/118 |
| 10,175,306 | B1 | 1/2019 | Miesner | |
| 10,848,044 | B1 | 11/2020 | Miesner | |
| 10,930,838 | B1 | 2/2021 | Miesner | |

(Continued)

OTHER PUBLICATIONS

U.S. Appl. No. 17/206,929, filed Mar. 19, 2021, Navy Case No. 114,044, inventors John E. Miesner and George G. Zipfel Jr., title "Linear Magnetostrictive Actuator" (divisional of U.S. Appl. No. 16/136,742, now U.S. Pat. No. 10,998,487).

(Continued)

*Primary Examiner* — Jue Zhang
(74) *Attorney, Agent, or Firm* — Howard Kaiser

(57) ABSTRACT

Exemplary practice of the present invention provides a magnetostrictive actuator characterized by linear force output and uniform magnetic biasing. A center bias magnet combined with a flux transfer tube produces a uniform magnetic bias down the length of a magnetostrictive component. Depending on the inventive embodiment, the magnetostrictive component may include one magnetostrictive element or a pair of collinear magnetostrictive elements. A center bias magnet, in combination with a flux transfer tube, drives magnetic flux through the magnetostrictive component (e.g., a series of magnetostrictive rods) in opposite directions, while surrounding drive coils apply flux in the same direction through the magnetostrictive component. The net response is substantially linear with respect to the drive coil current. The flux transfer tube applies distributed magnetic flux to the magnetostrictive component at a rate that ensures uniform magnetic flux density down the length of the magnetostrictive component.

6 Claims, 11 Drawing Sheets

(56) References Cited

U.S. PATENT DOCUMENTS

| | | | |
|---|---|---|---|
| 10,998,487 B1 | 5/2021 | Miesner et al. | |
| 11,239,736 B1 | 2/2022 | Miesner | |
| 2002/0025260 A1* | 2/2002 | Maruyama | F04B 19/006 |
| | | | 417/322 |

OTHER PUBLICATIONS

U.S. Appl. No. 17/142,656, filed Jan. 6, 2021, Navy Case No. 104,114, inventor John E. Miesner, title "Linearized Pull-Pull Electromagnetic Actuators, Systems, and Methods".

Office action (election/restriction requirement; 9 pages), dated Jan. 6, 2022, U.S. Appl. No. 17/142,656, filed Jan. 6, 2021, Navy Case No. 104,114, inventor John E. Miesner.

* cited by examiner

MAGNETOSTRICTIVE ACTUATOR WITH CENTER BIAS

CROSS-REFERENCE TO RELATED APPLICATIONS

This application is a divisional of U.S. nonprovisional patent application Ser. No. 15/717,658, filing date 27 Sep. 2017, hereby incorporated herein by reference, entitled "Magnetostrictive Actuator With Center Bias," inventor John E. Miesner.

STATEMENT OF GOVERNMENT INTEREST

The invention described herein may be manufactured and used by or for the Government of the United States of America for governmental purposes without payment of any royalties thereon or therefor.

BACKGROUND OF THE INVENTION

The present invention relates to magnetostrictive actuators, more particularly to magnetostrictive actuators that seek to produce a linear force output and/or a uniform magnetic bias flux in the magnetostrictive elements.

Magnetostrictive actuators offer great promise for applications that require a high force output over a wide bandwidth. However, magnetostrictive materials have two characteristics that limit their use. The first limiting characteristic is the inherent nonlinear material response in strain to magnetic flux density. Many applications require a linear force output that has not been achieved by the current art for magnetostrictive actuators. The second limiting characteristic is the relatively low permeability of magnetostrictive materials insofar as it makes it difficult to achieve a uniform magnet bias down the length of the magnetostrictive element due to flux leakage.

U.S. Pat. No. 5,451,821 to Teter et al., incorporated herein by reference, teaches a method of compensating for magnetic flux leakage using magnets outside the drive coils to apply a magnetic field perpendicular to the desired bias direction. Teter et al.'s method has proven to be effective and has been widely adopted in the design of magnetostrictive actuators. However, the perpendicular magnets required by Teter et al. are relatively large, thus increasing the size and cost of an actuator using this method. The perpendicular magnets also cause large magnetic fields external to the actuator, which are not acceptable in many applications. These external fields cannot be effectively shielded by the usual method of surrounding the entire actuator with a ferromagnetic case, because doing so would short out the perpendicular magnet flux.

U.S. Pat. No. 6,891,286 to Flanagan et al., incorporated herein by reference, teaches large axially polarized disk magnets at each end of a magnetostrictive rod to achieve a uniform magnetic flux down the length of the rod. However, this approach of Flanagan et al. does nothing to address the inherent nonlinear material response, requires large magnets, and has large external magnetic fields.

SUMMARY OF THE INVENTION

In view of the foregoing, it is an object of the present invention to provide a magnetostrictive actuator having linear force output and uniform magnetic biasing in the magnetostrictive elements.

An exemplary embodiment of the present invention is a magnetostrictive actuator that produces a linear force output and which uses a center bias magnet and flux transfer tube to produce a uniform magnetic bias down the length of the magnetostrictive elements without external magnetic fields.

An exemplary magnetostrictive actuator according to the present invention comprises a coil component, a magnetostrictive component situated inside the coil component, an output shaft situated inside the magnetostrictive component, a support member situated inside the coil component and attached to the magnetostrictive component and to the output shaft at one longitudinal end of the output shaft, a magnet ring interposed between the first coil element and the second coil element, and a flux transfer tube contiguous the magnet ring and situated outside the magnetostrictive component and inside the coil component and the magnet ring. The coil component, the magnetostrictive component, the output shaft, the support member, the magnet ring, and the output shaft are each at least substantially cylindrical and are characterized by the same geometric longitudinal axis. The coil component is capable of carrying current and of producing a fluctuating magnetic field, in the magnetostrictive component, that is proportional to the current carried by the coil component. The magnetostrictive component magnetostrictively changes in shape in accordance with the fluctuating magnetic field. The support member and hence the output shaft move in an axial direction in accordance with the magnetostrictive changing in shape of the magnetostrictive component. The magnet ring and the flux transfer tube, in combination, are configured to transfer magnetic flux from the magnet ring to the magnetostrictive component so as to provide an at least substantially uniform magnetic bias along the longitudinal axis.

According to some inventive embodiments a surrounding ferromagnetic case completes the flux path. The flux transfer tube applies distributed magnetic flux to the magnetostrictive component at a rate that ensures uniform flux density down the length of the magnetostrictive component. The closed flux path and ferromagnetic case ensure that the external magnetic field is insignificant.

U.S. Pat. No. 5,587,615 to Murray et al., incorporated herein by reference, teaches a method to linearize the output of a magnetic actuator with force generated across air gaps. Murray arranges two air gaps with the total actuator force equal to the difference of the forces across them, and then establishes (i) magnetic bias flux in opposite directions in the two air gaps and (ii) coil flux in the same direction in the two air gaps. Therefore, as coil flux increases it tends to cancel the bias flux in one gap and add to the bias flux in the other gap.

The inherent force generated across an air gap is quadratic with respect to the total flux across the gap. If the bias flux is $\Phi_{bias}$ and the coil flux is $\Phi_{coil}$, then the force in one gap can be written as $F=k(\Phi_{bias}\pm\Phi_{coil})^2$ where k is a proportionality constant dependent on the geometry. The net force in the two gaps can be written as $F_{net}=k[(\Phi_{bias}+\Phi_{coil})^2-(\Phi_{bias}-\Phi_{coil})^2]$. Simplifying this equation yields $F_{net}=4k\Phi_{bias}\Phi_{coil}$. Thus, the net output force is linear with respect to the coil flux.

The response of a magnetostrictive material such as Terfenol is substantially quadratic with respect to magnetic flux density through the material up to the flux level at which it begins to saturate. The present invention uses this quadratic response characteristic to produce a linear net output force in a manner somewhat analogous to that produced according to the method of Murray et al.

Various preferred modes of practicing the present invention include what are referred to herein as a "first" mode of inventive practice and a "second" mode of inventive practice. According to both the first mode and the second mode of practicing the present invention, the output force is linear over the magnetic flux density range for which the magnetostrictive material response is quadratic.

According to the first mode of practice of the present invention, a center radial bias magnet ring drives flux through two magnetostrictive elements in opposite directions while surrounding drive coils apply magnetic flux in the same direction through the two elements. The force output connection is between the two elements; therefore, the net output is the difference of the forces respectively generated in the two magnetostrictive elements.

According to the second mode of practice of the present invention, a center radial bias magnet ring drives flux through a single magnetostrictive element in opposite directions in upper and lower halves while surrounding drive coils apply magnetic flux in a single direction. The force output connection is at the center of the element; therefore, the net output is the difference of the forces respectively generated in the upper and lower halves of the single magnetostrictive element.

Exemplary practice of the present invention achieves a substantially uniform magnetic flux density down the length of the magnetostrictive elements by implementing a flux transfer tube between the center radial bias magnet ring and the magnetostrictive elements. The shape of the flux transfer tube is optimized to transfer flux into the magnetostrictive elements at the same rate as it leaks out, resulting in no net loss of flux down the length of the elements.

Some embodiments of the present invention provide for implementation of a flux transfer tube, whereas other inventive embodiments do not. Inventive use of the flux transfer tube is optional, depending on the magnetic permeability of the material used and the distance between the magnetostrictive elements and the surrounding flux return. For Galfenol, acceptable performance may be achieved without a flux transfer tube if the element length is less than about four times the separation distance. Because Terfenol has a lower magnetic permeability, a flux transfer tube is generally necessary if the element length is more than about two times the separation distance.

Some embodiments of the present invention impose a mechanical compressive preload on the magnetostrictive elements using one or more springs (e.g., metal spring or elastomeric spring) so as to afford a mechanical compressive preload. For instance, the spring can be a helical (e.g., cambered) metal spring or a resilient (e.g., rubber) disk. These embodiments are preferred for magnetostrictive materials that benefit from compressive preload, such as Terfenol. Inventive embodiments that do not implement a spring are preferred for magnetostrictive materials that benefit from and can withstand tensile preload, such as Galfenol.

This United States patent application is related to U.S. nonprovisional patent application Ser. No. 16/136,742, filing date 20 Sep. 2018, hereby incorporated herein by reference, entitled "Linear Magnetostrictive Actuator," joint inventors John E. Miesner and George G. Zipfel, Jr., which claims the benefit of U.S. provisional patent application No. 62/564,100, filing date 27 Sep. 2017, hereby incorporated herein by reference, entitled "Linear Magnetostrictive Actuator," joint inventors John E. Miesner and George G. Zipfel.

BRIEF DESCRIPTION OF THE DRAWINGS

The present invention will now be described, by way of example, with reference to the accompanying drawings, wherein like numbers indicate same or similar parts or components, and wherein.

DESCRIPTION OF EXEMPLARY EMBODIMENTS OF THE INVENTION

Figure 1:
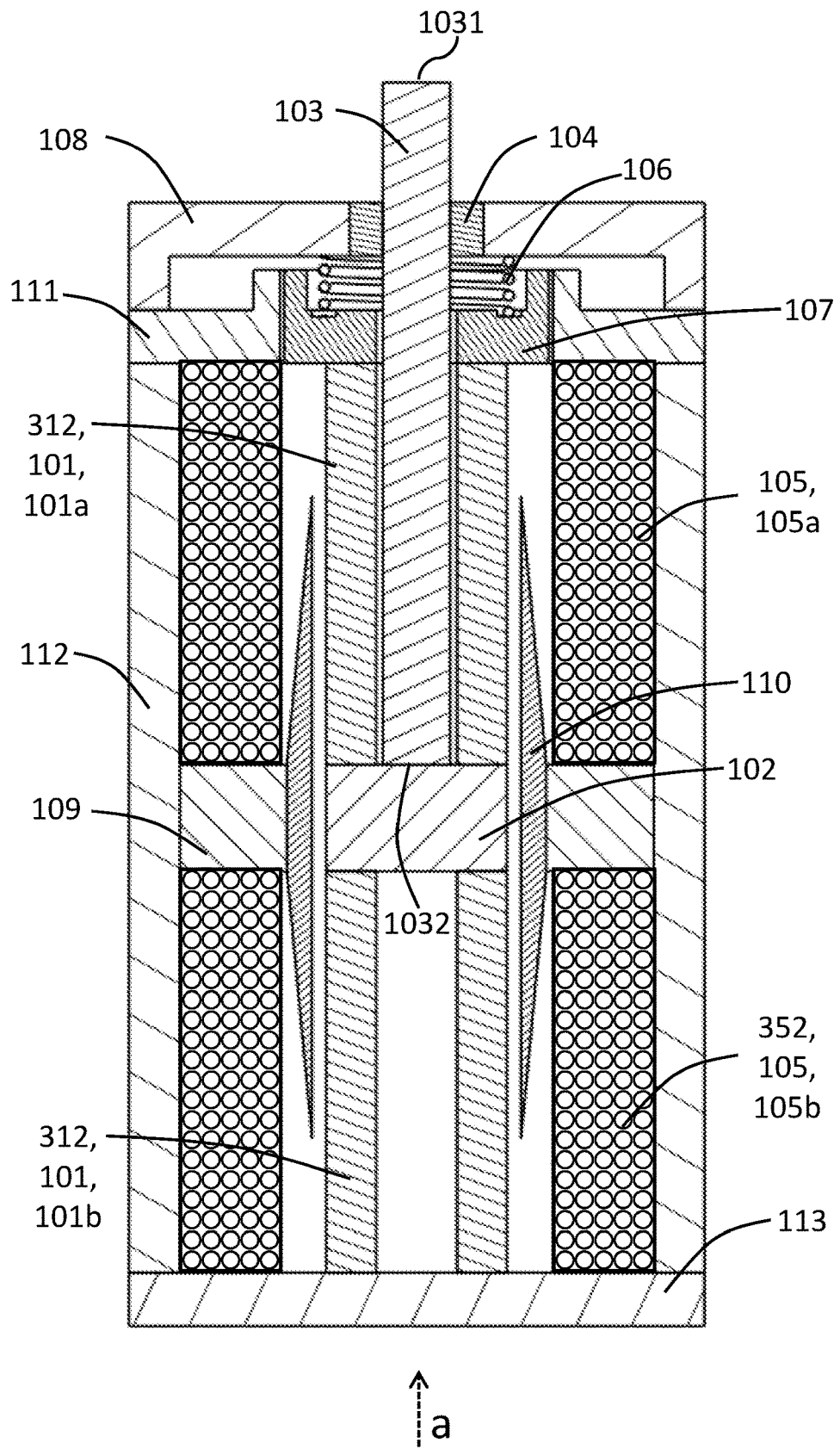
FIG. 1 is a cross-sectional view of an exemplary embodiment of the first mode of practice of the present invention.
Figure 2:
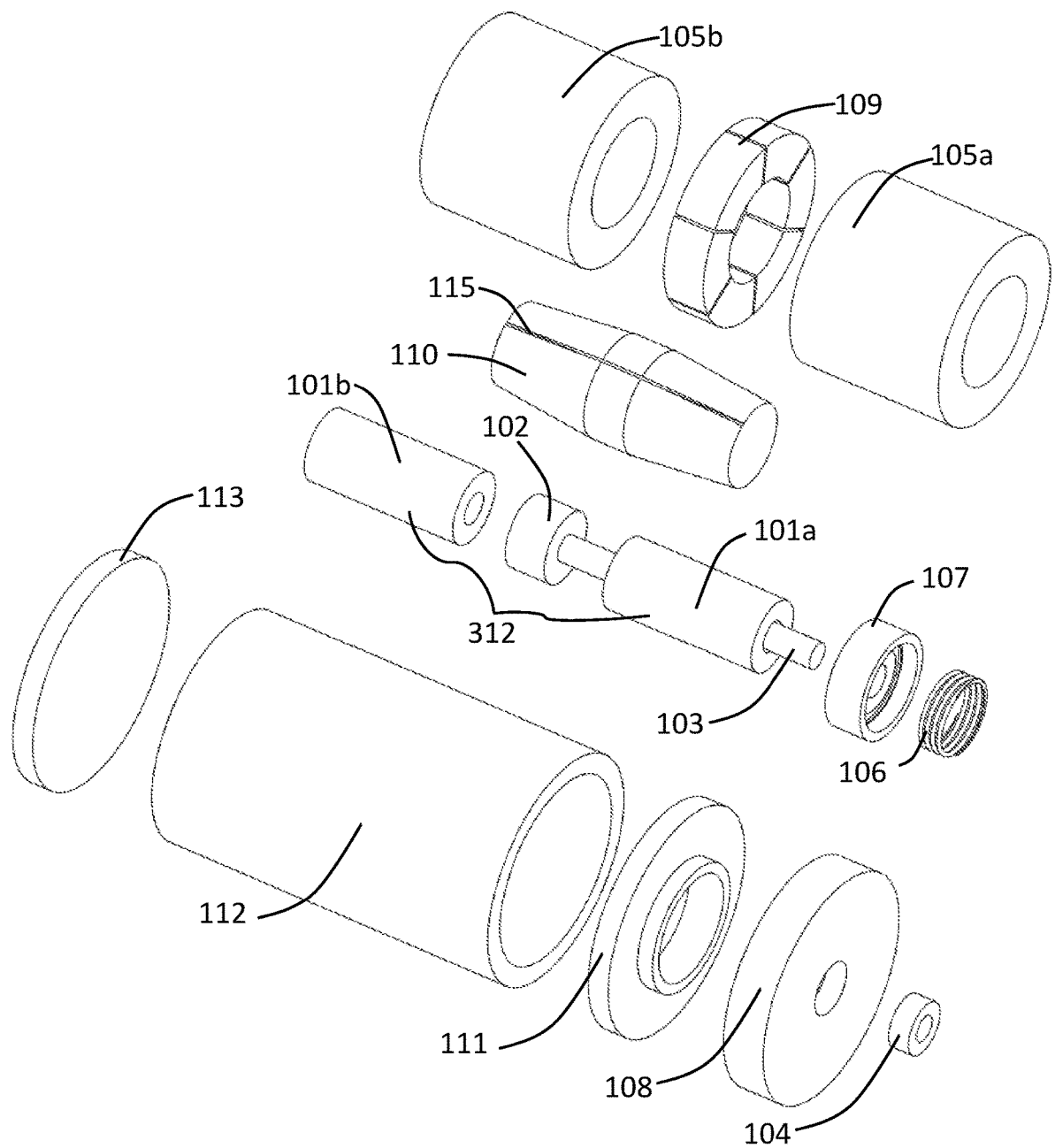
FIG. 2 is an exploded view of the inventive embodiment illustrated in FIG. 1.

FIG. 1 and FIG. 2 are two views exemplifying the first mode of practice of a magnetostrictive actuator in accordance with the present invention. The inventive actuator depicted includes a magnetostrictive component 312, which includes two magnetostrictive elements 101, viz., 101a and 101b. Top magnetostrictive element 101a and bottom magnetostrictive element 101b are each in contact with center support 102 such that changes in the respective lengths of the magnetostrictive elements 101 correspondingly move center support 102 in the axial direction a. Center support 102 is moved vertically, either upward or downward, as shown by bidirectional arrow a in FIG. 1. Output shaft 103 is connected to center support 102 and therefore moves in one of two opposite axial-longitudinal directions in accordance with the axial-longitudinal movement of center support 102.

Output shaft 103 has an inner shaft end (lower shaft end 1032 as shown in FIG. 1) and an outer shaft end (upper shaft end 1031 as shown in FIG. 1). Output shaft 103 is attached to center support 102 at lower shaft end 1032. Output shaft 103 moves with center support 102 in axial direction a. Support bearing 104 provides radial support to output shaft 103 while allowing output shaft 103 to move in axial direction a. A current-carrying coil component 352 includes two current-carrying coils 105, viz., coils 105a and 105b, and surrounds magnetostrictive elements 101. That is, top coil 105a and bottom coil 105b surround magnetostrictive elements 101a and 101b, respectively, wherein coils 105a and 105b produce a fluctuating magnetic field in magnetostrictive elements 101a and 101b that is proportional to the electrical current. According to exemplary inventive practice, top coil 105a and bottom coil 105b are congruous, such as shown in FIG. 1. However, depending on the inventive embodiment, coils 105a and 105b may have the same shape or may differ in shape, such as having equal or unequal axial lengths.

The magnetostrictive elements 101a and 101b change length in accordance with their magnetostrictive characteristics, moving center support 102 and output shaft 103 to produce useful work in response to the coil current. Optimum actuator output may be inventively obtained for magnetostrictive materials such as Terfenol when the elements 101a and 101b have a mechanical compressive preload and a magnetic bias. For instance, as shown in FIG. 1, the mechanical compressive preload is provided by spring 106, which presses down on top support 107 which is in contact with top magnetostrictive element 101a. Spring 106 presses up against cylinder closure 108, which also supports bearing 104.

Magnetic bias is provided by radially polarized magnet ring 109, which is in contact with flux transfer tube 110. Flux transfer tube 110 surrounds center support 102 and magnetostrictive elements 101a and 101b, and transfers magnetic flux to magnetostrictive elements 101a and 101b from magnet ring 109. Flux transfer tube 110 is designed to provide a substantially uniform magnetic bias down the length of magnetostrictive elements 101a and 101b. As shown in FIG. 1 and FIG. 2, flux transfer tube 110 is cylindrical having a thick wall in the axial middle, where the flux transfer tube 110 attaches to the bias magnet ring 109. The wall thickness of flux transfer tube 110 decreases toward its two axial ends to form a tapered outer surface.

It should be noted that flux from radially polarized magnet ring 109 will flow oppositely in top magnetostrictive element 101a and bottom magnetostrictive element 101b. For example, if the flux direction is up in top magnetostrictive element 101a, then it will be down in bottom magnetostrictive element 101b. It should be further noted that the flux direction from current-carrying coils 105a and 105b is in the same direction in both magnetostrictive elements 101a and 101b.

Therefore, the total flux at any particular current level will be higher than the bias flux in one magnetostrictive element 101, and will be lower than the bias flux in the other magnetostrictive element 101. Consequently, as electrical current increases, one of the magnetostrictive elements 101 will be elongating and the other will be shortening, thereby moving center support 102 either up or down in axial direction a. When the current reverses, center support 102 will reverse direction along axial direction a. The flux path for both radially polarized magnet ring 109 and for drive coils 105a and 105b is completed by top support 107, top flux return 111, cylindrical flux return 112, and bottom flux return 113, which are preferably made of a material such as silicon steel to provide high permeability and low hysteresis, and which may for example be composed of flat or spiral wound laminations.

It should be noted that magnetostrictive elements 101a and 101b are each cylindrical in nature, with an axial hole down the length, and are situated coaxially along their respective lengths. As shown in FIG. 1, a straight output shaft 103 passes through the axial-longitudinal hole of top magnetostrictive element 101a. According to exemplary inventive embodiments, magnetostrictive elements 101a and 101b are geometrically congruous (i.e., have the same axial length, diameter, and wall thickness), such as shown in FIG. 1, and are each homogenous. However, depending on the inventive embodiment, magnetostrictive elements 101a and 101b may have the same shape or may differ in shape, such as having equal or unequal axial lengths.

Furthermore, in inventive practice, neither magnetostrictive element 101a nor magnetostrictive element 101b need be homogeneous, and either element or both elements may be composed of sub-elements. For example, either or both of magnetostrictive elements 101a and 101b may be composed of radial, transverse, or axial laminates, or may be composed of an array of rods or bars of arbitrary cross-section. An essential consideration in inventive first-mode practice is that magnetostrictive elements 101a and 101b are disposed uniformly around output shaft 103 and provide uniform ends upon which bottom flux return 113, center support 102, and top support 107 can bear.

Radially polarized magnet ring 109 is preferably composed, for example, of a series of high strength magnet segments, and is in contact with and bonded to flux transfer tube 110. Flux transfer tube 110 is preferably made of a material such as silicon steel to provide high permeability and low hysteresis. Flux transfer tube 110 preferably includes an interruption, such as vertical slit 115, to prevent eddy currents from circulating circumferentially.

Figure 3:
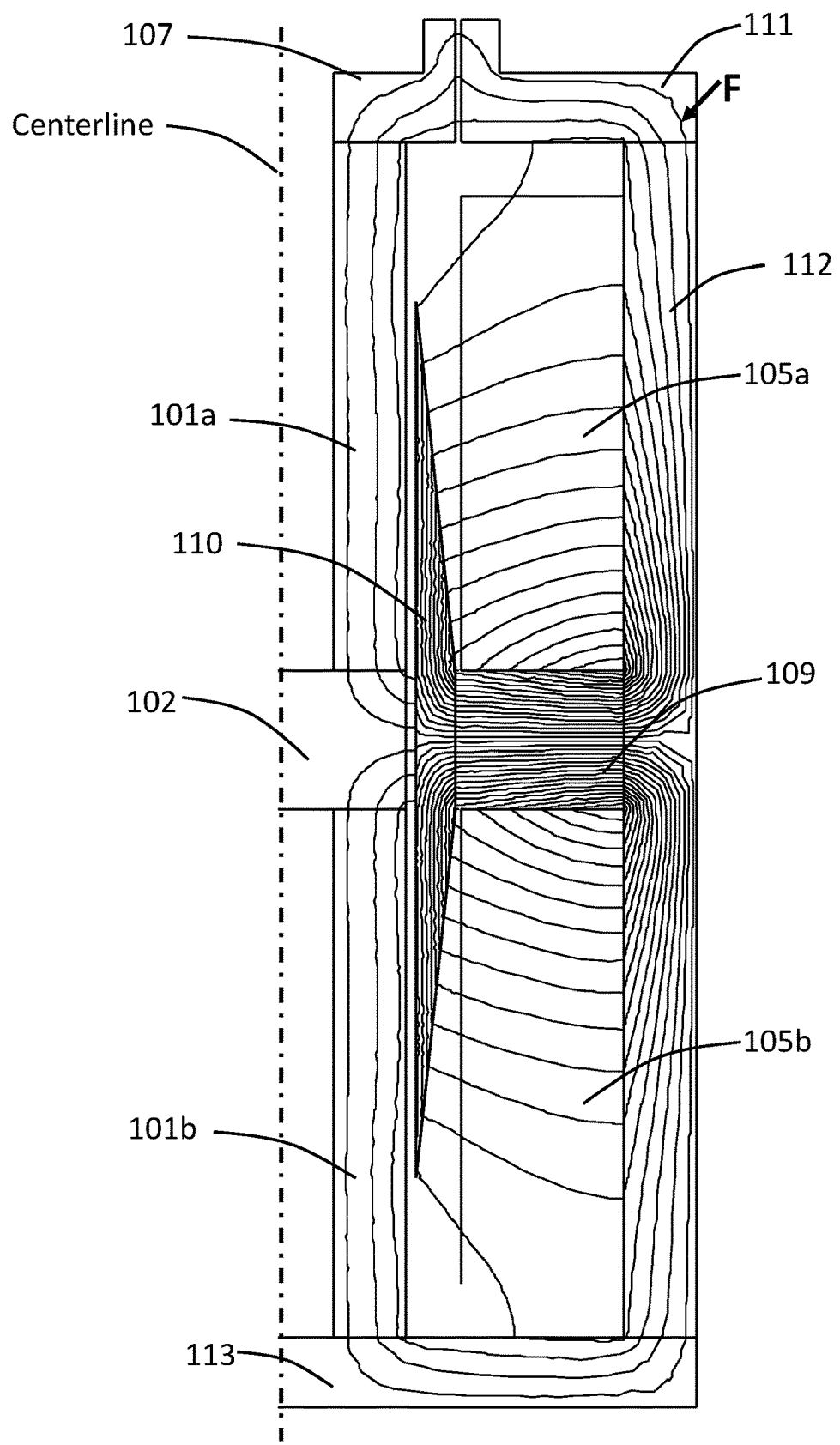
FIG. 3 shows an example of the calculated magnetic flux lines with no drive current for an embodiment of the first mode of inventive practice, such as shown by way of example in FIG. 1.

FIG. 3 shows an axisymmetric magnetic model exemplifying the first mode of practice of the present invention under condition of no current flow through the drive coils 105. The magnetostrictive material is Terfenol for this example. The calculated magnetic flux paths are illustrated by lines F. With no drive coil current flow, all flux lines F flow from bias magnet 109 and form closed upper and lower loops back to bias magnet 109. It can be seen in FIG. 3 that top magnetostrictive element 101a and bottom magnetostrictive element 101b have respective bias fluxes in opposite directions from each other.

Figure 4:
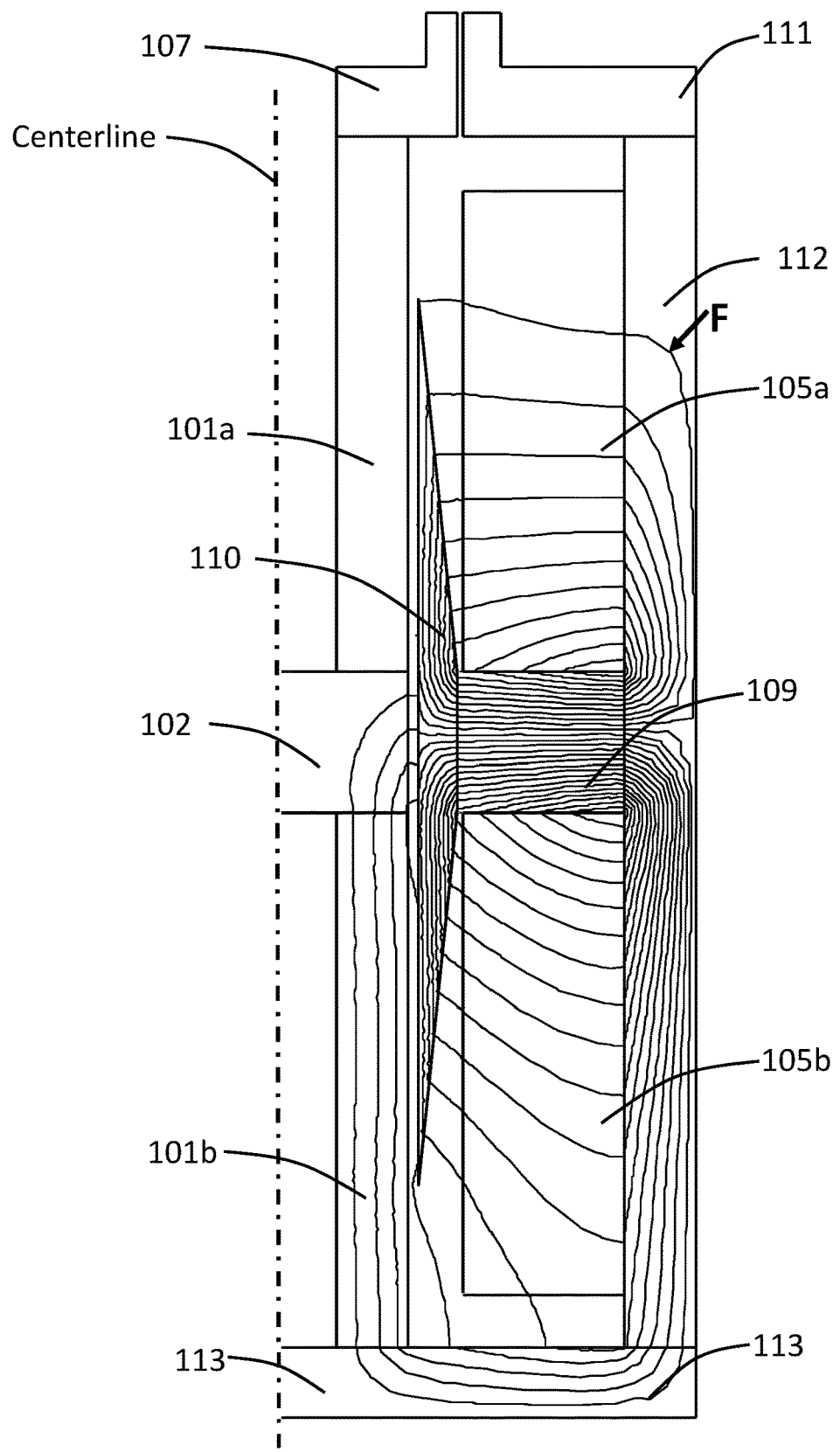
FIG. 4 shows an example of the calculated magnetic flux lines at maximum drive current for an embodiment of the first mode of inventive practice, such as shown by way of example in FIG. 1.

FIG. 4 shows the same axisymmetric magnetic model as FIG. 3, but under condition of maximum rated current flow through drive coils 105a and 105b. In the example illustrated in FIG. 4, the magnetic flux from the drive coils and from bias magnet 109 reinforces in the bottom magnetostrictive element 101b and cancels in the top magnetostrictive element 101a. Thus the bottom magnetostrictive element 101b elongates and the top magnetostrictive element 101a shortens with respect to the no-drive-current condition moving center support 102 in the upward direction. If the direction of current flow is reversed, then the magnetic flux from the drive coils and from bias magnet 109 will cancel in the bottom magnetostrictive element 101a and reinforce in the top magnetostrictive element 101b, thereby moving center support 102 in the downward direction.

Figure 5:
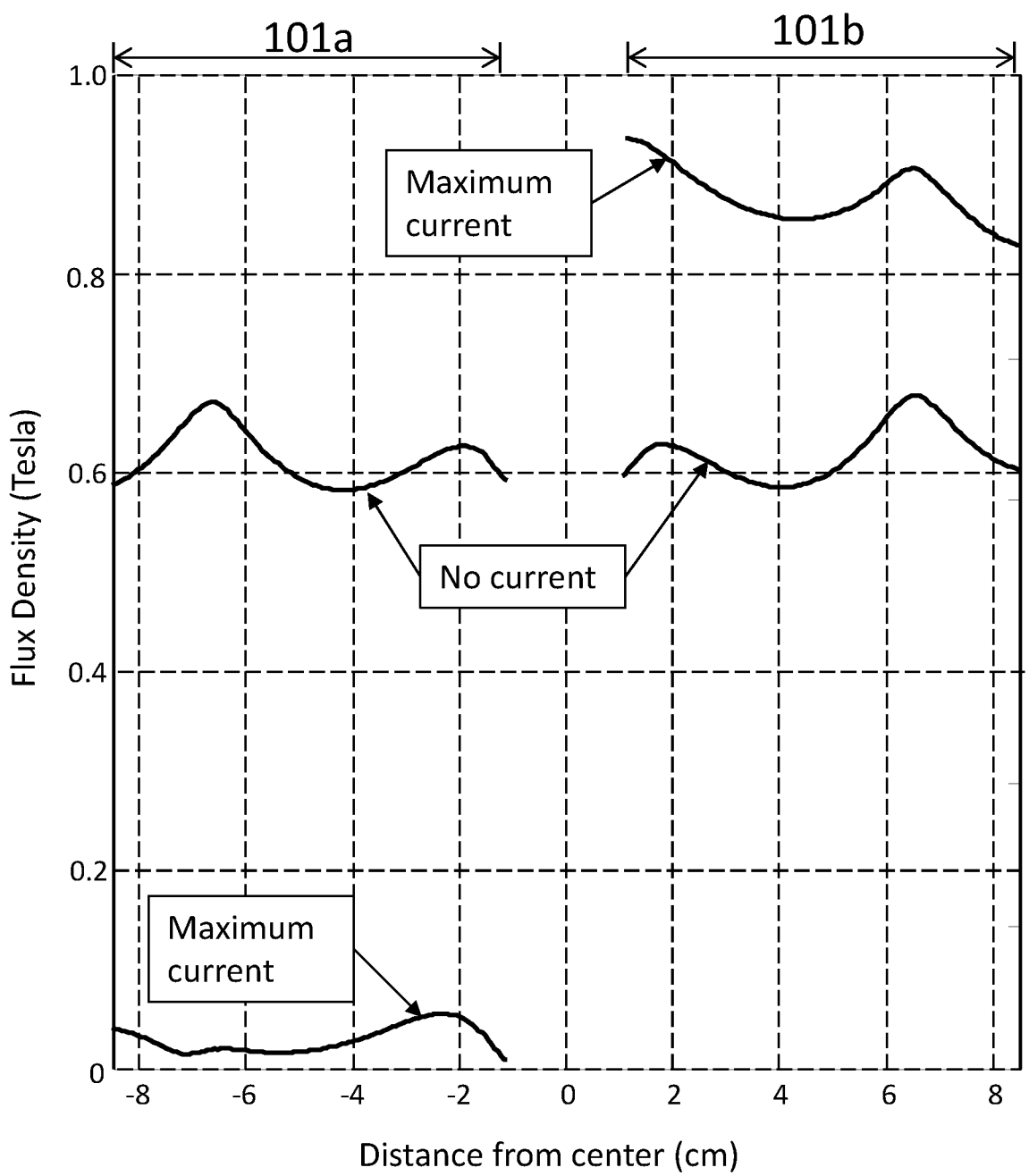
FIG. 5 shows an example of the calculated magnetic flux density for a contour line down the magnetostrictive elements at no drive current and at maximum drive current for an embodiment of the first mode of inventive practice, such as shown by way of example in FIG. 1.

FIG. 5 is a plot of the calculated flux density from the examples of FIG. 3 and FIG. 4, for an axial contour at a radius halfway between the center hole and the outer surface for magnetostrictive elements 101a and 101b. It can be seen in FIG. 5 that under condition of no current flow through the drive coils 105, the bias flux is nearly constant at 0.6 Tesla down the length of the magnetostrictive elements 101. Under condition of maximum rated current flow, the magnetic flux density in magnetostrictive element 101*a* is nearly zero, while the magnetic flux density in magnetostrictive element 101*b* is about 0.9 Tesla. If the direction of current flow were reversed, these flux density values would also reverse.

Figure 6:
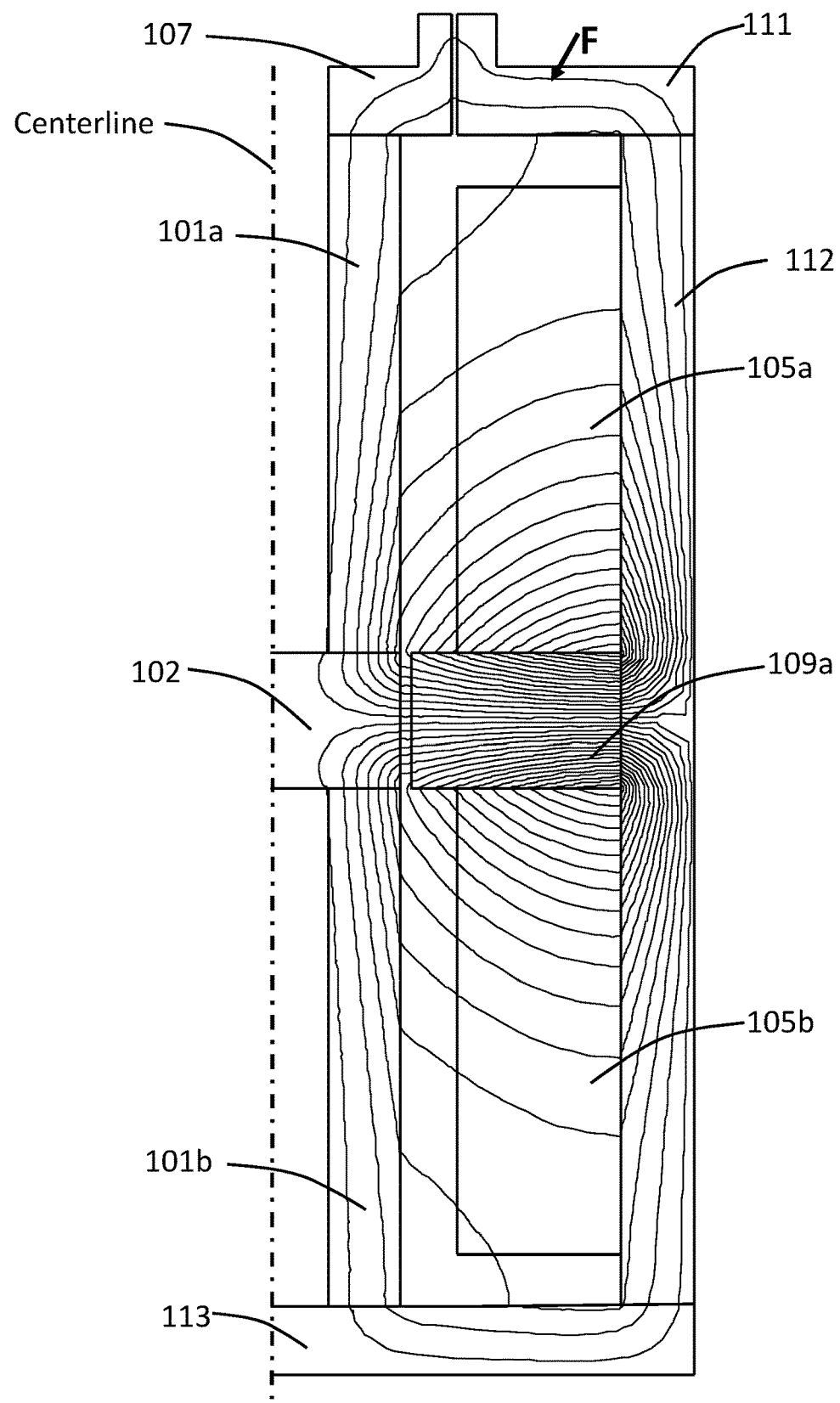
FIG. 6 shows an example of the calculated magnetic flux lines with no drive current for an embodiment of the first mode of inventive practice, such as shown by way of example in FIG. 1.

FIG. 6 shows the same exemplary axisymmetric magnetic model as FIG. 3, but with the flux transfer tube 110 removed. The inventive embodiment shown in FIG. 3 has bias magnet ring 109 and flux transfer tube 110. The inventive embodiment shown in FIG. 6 has bias magnet ring 109*a* and does not have a flux transfer tube such as flux transfer tube 110. Bias magnet ring 109*a* (shown in FIG. 6) has a smaller inner diameter than bias magnet ring 109 (shown in FIG. 3), to compensate for the removal. It can be seen in FIG. 6 that without flux transfer tube 110, flux leakage from magnetostrictive elements 101*a* and 101*b* causes the number of flux lines to reduce with distance from bias magnet 111, which indicates that the magnetic flux density is decreasing. With the flux transfer tube 110 in place as in FIG. 3, the number of flux lines is constant in magnetostrictive elements 101*a* and 101*b*, indicating a substantially uniform magnetic flux density.

In practicing many embodiments of the first mode of the present invention, the optimum shape of flux transfer tube 110 may be calculated by a person having ordinary skill in the art who reads the instant disclosure. The ordinarily skilled artisan may perform this calculation using a magnetic model and adjusting geometric parameters until the flux is at the desired level and within acceptable bounds of uniformity. The optimum shape of flux transfer tube 110 depends upon the magnetic permeability of the magnetostrictive material, and is a compromise because the permeability varies with magnetic flux level and stress. For a low permeability material, such as Terfenol, the flux transfer tube 110 is cylindrical with a thick wall in the axial middle, where flux transfer tube 110 attaches to the bias magnet ring 109, and with the wall thickness decreasing toward the two axial ends of flux transfer tube 110 to form a tapered outer surface. The taper angle corresponds to the flux density reduction rate as the flux leaks out down the length of the tube 110 as shown in FIG. 3. The optimum taper angle is realized when the flux lines in magnetostrictive elements 101*a* and 101*b* are constant and vertical as shown in FIG. 3.

Figure 7:
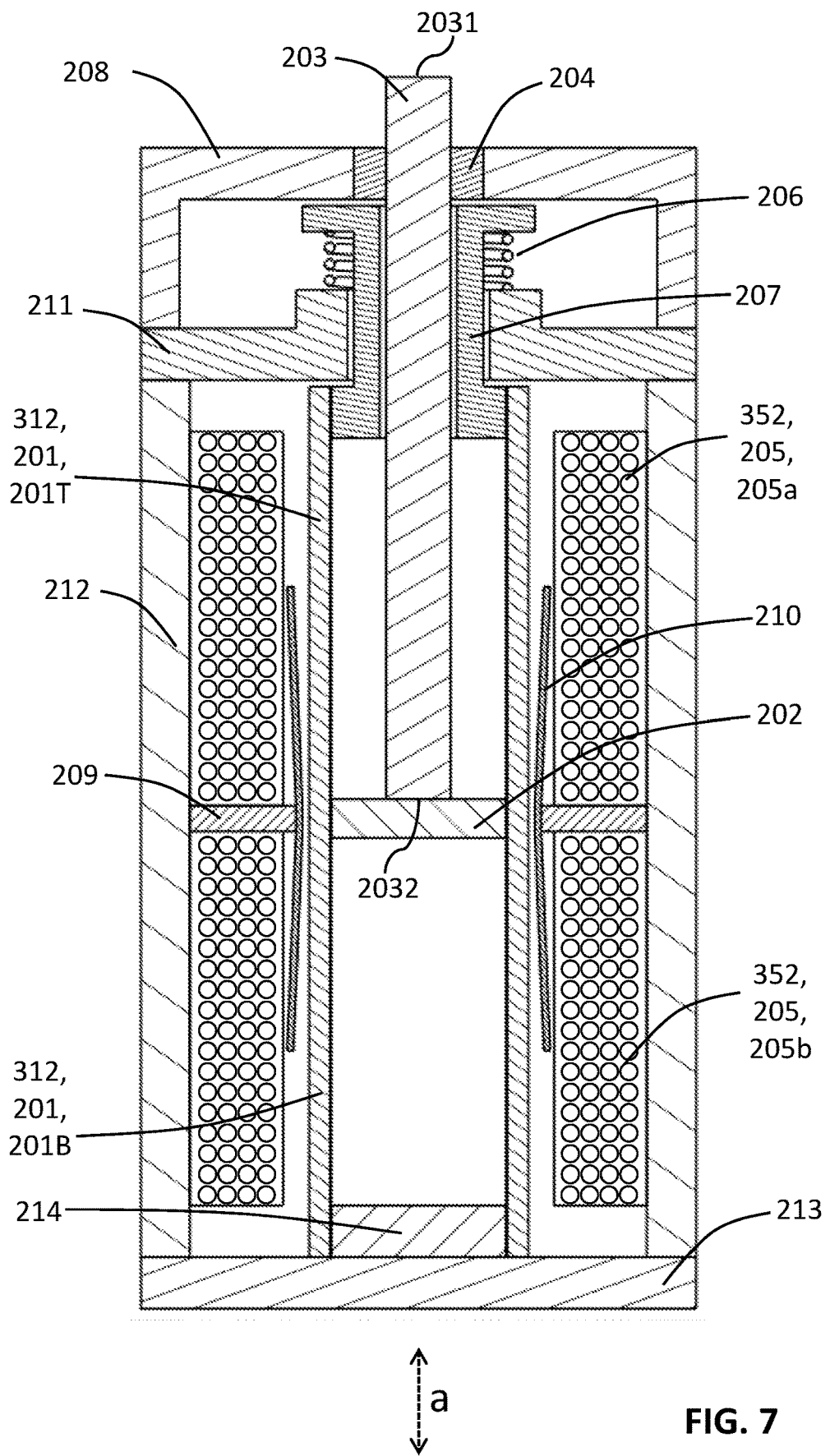
FIG. 7 is a cross-sectional view of an exemplary embodiment of the second mode of practice of the present invention.
Figure 8:
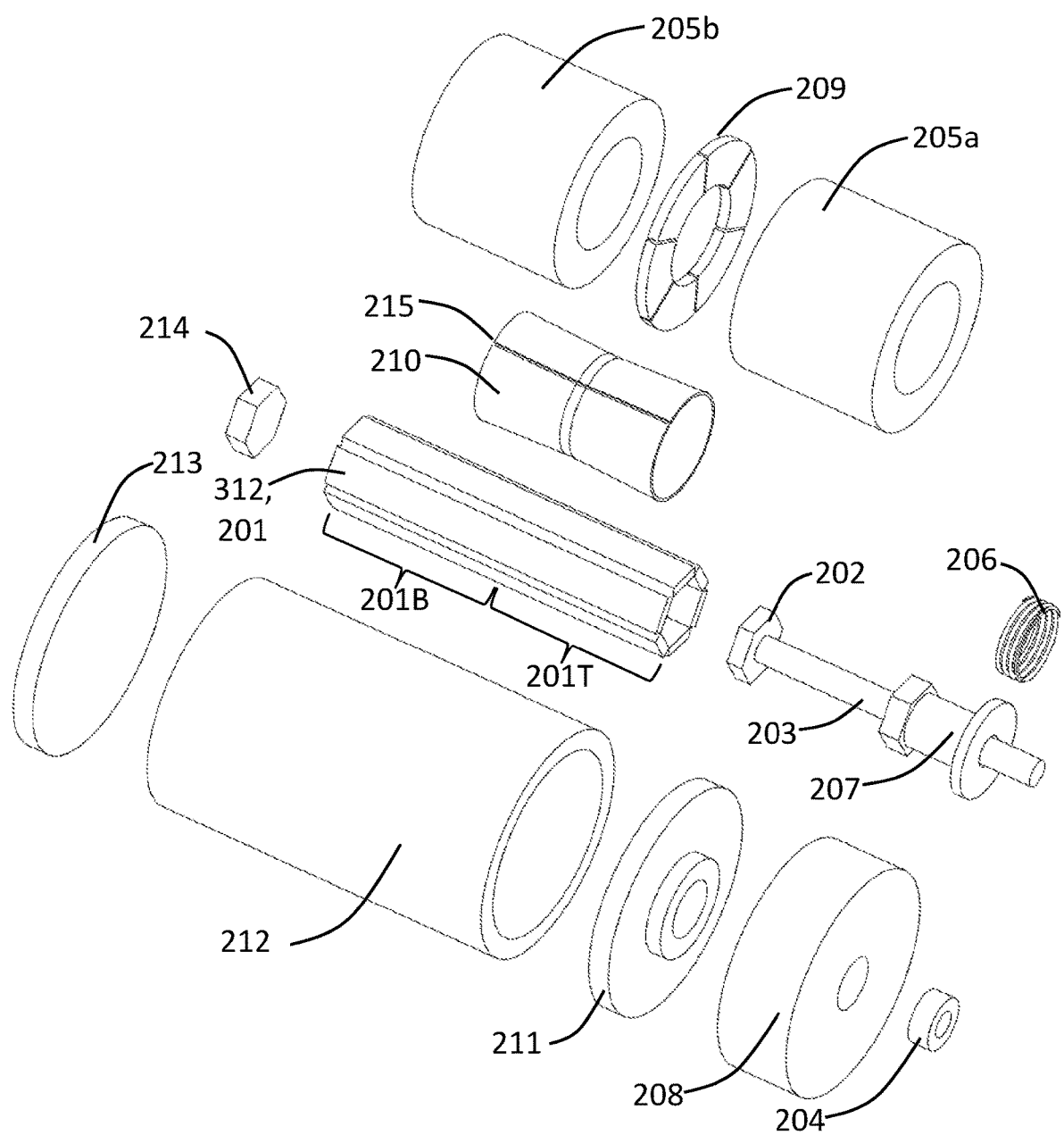
FIG. 8 is an exploded view of the inventive embodiment illustrated in FIG. 7.

FIG. 7 and FIG. 8 are two views of the second mode of practice of the present invention. The inventive actuator depicted in FIGS. 7 and 8 includes a magnetostrictive component 312, which includes one magnetostrictive element, viz., magnetostrictive element 201. According to this inventive example, magnetostrictive component 312 includes a single magnetostrictive element 201, which is characterized by a top magnetostrictive element half 201T and a bottom magnetostrictive element half 201B. Magnetostrictive element 201 is attached to center support 202 such that change from center position of magnetostrictive element 201 correspondingly moves center support 202 in the axial direction a. Center support 102 is moved vertically, either upward or downward, as shown by bidirectional arrow a in FIG. 7. Output shaft 203 is connected to center support 202 and therefore moves in one of two opposite axial-longitudinal directions in accordance with the axial-longitudinal movement of center support 202.

Output shaft 203 has an inner shaft end (lower shaft end 2032 as shown in FIG. 1) and an outer shaft end (upper shaft end 2031 as shown in FIG. 1). Output shaft 203 is attached at its lower shaft end 2032 to center support 202. Output shaft 203 moves with center support 202 in the axial direction a. Support bearing 204 provides radial support to output shaft 203 while allowing it to move in axial direction a. Two current-carrying coils 205—viz., top coil 205*a* and bottom coil 205*b*—surround magnetostrictive element 201, producing a fluctuating magnetic field in the element proportional to the current. According to exemplary inventive practice, top coil 205*a* and bottom coil 205*b* are congruous. The top and bottom halves 201T and 201B of magnetostrictive element 201 each change length in accordance with its magnetostrictive characteristics, thereby moving center support 202 and output shaft 203 to produce useful work in response to the coil current.

For a magnetostrictive material such as Galfenol, optimum actuator output is obtained whenever the magnetostrictive element 201 has a mechanical tensile preload and a magnetic bias. The mechanical tensile preload is provided by spring 206, which presses upon top support 207, which is attached to magnetostrictive element 201. Bottom support 214 is also attached to magnetostrictive element 201 and transfers tensile force to bottom flux return 213. Spring 206 presses down against top flux return 211. Cylinder closure 208 supports bearing 204.

Magnetic bias is provided by radially polarized magnet ring 209, which is in contact with flux transfer tube 210. Flux transfer tube 210 surrounds center support 202 and magnetostrictive element 201 and transfers magnetic flux to it from magnet ring 209. Flux transfer tube 210 is designed to provide a substantially uniform magnetic bias down the length of magnetostrictive element 201. It should be noted that flux from radially polarized magnet ring 209 will flow oppositely in the top half 201T of magnetostrictive element 201 and the bottom half 201B. For example, if the flux direction is upward in the top half 201T of magnetostrictive element 201, then the flux direction will be down in the bottom half 201B of magnetostrictive element 201. It should be further noted that the flux direction from current carrying coils 205*a* and 205*b* is in the same direction through the length of magnetostrictive element 201.

Therefore, the total flux at any particular current level will be higher than the bias flux in one half of magnetostrictive element 201, and lower in the other half of magnetostrictive element 201. Consequently, as current increases, one of the two halves of magnetostrictive element 201 will be elongating and the other will be shortening, thereby moving center support 202 in the axial direction. For instance, element top half 201T lengthens and element bottom half 201B shortens; or, element bottom half 201B lengthens and element top half 201T shortens. When the current reverses, center support 202 will also reverse direction. The flux path for both radially polarized magnet ring 209 and for drive coils 205*a* and 205*b* is completed by top support 207, top flux return 211, cylindrical flux return 212, and bottom flux return 213, which are preferably made of a material such as silicon steel to provide high permeability and low hysteresis, and which may for example be composed of flat or spiral wound laminations.

It should be noted that magnetostrictive element 201 is cylindrical in nature, with an axial hole down the length, but need not be homogeneous and may be composed of sub-elements. For example, magnetostrictive element 201 may be composed of radial, transverse, or axial laminates or may be composed of an array of rods or bars of arbitrary cross section. An essential consideration is that magnetostrictive element 201 is disposed uniformly around output shaft 203 and allows attachment to bottom flux return 213, center support 202, and top support 207 by bonding, welding, or mechanical means. For Galfenol, the preferred arrangement for magnetostrictive element 201 is a circumferential array of flat bars as shown in FIG. 8. Magnetostrictive elements 101a and 101b (shown FIG. 1 and FIG. 2) are cylindrical, whereas magnetostrictive element 201 (shown FIG. 1 and FIG. 2) is hexagonally prismatic. As used herein, the term "at least substantially cylindrical" refers to an axially symmetrical shape such as a cylinder or a prism having at least six sides.

Radially polarized magnet ring 209 is preferably composed of a series of high strength magnet segments and is in contact with and bonded to flux transfer tube 210. Flux transfer tube 210 is preferably made of a material such as silicon steel to provide high permeability and low hysteresis. Flux transfer tube 210 preferably includes an interruption, such as vertical slit 215, to prevent eddy currents from circulating circumferentially.

Figure 9:
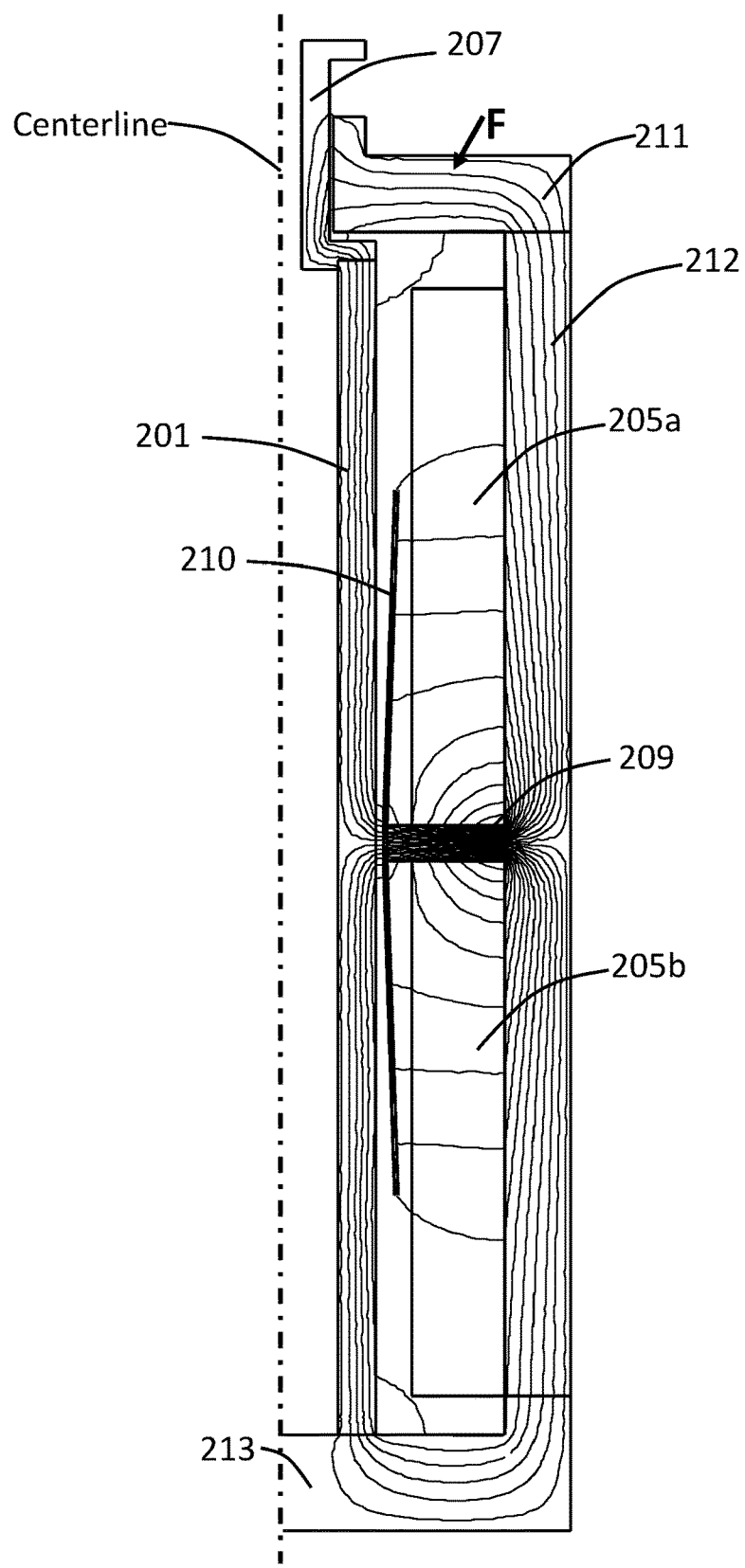
FIG. 9 shows an example of the calculated magnetic flux lines with no drive current for an embodiment of the second mode of inventive practice, such as shown by way of example in FIG. 7.

FIG. 9 shows an axisymmetric magnetic model exemplifying the second mode of practice of the present invention under condition of no current flow through the drive coils. The magnetostrictive material is Galfenol for this example. The calculated magnetic flux paths are illustrated by lines F. With no drive coil current flow, all flux lines F flow from bias magnet 209 and form closed upper and lower loops back to bias magnet 209. It can be seen in FIG. 9 that top half 201T and bottom half 201B of magnetostrictive element 201 have respective bias fluxes in opposite directions from each other.

Figure 10:
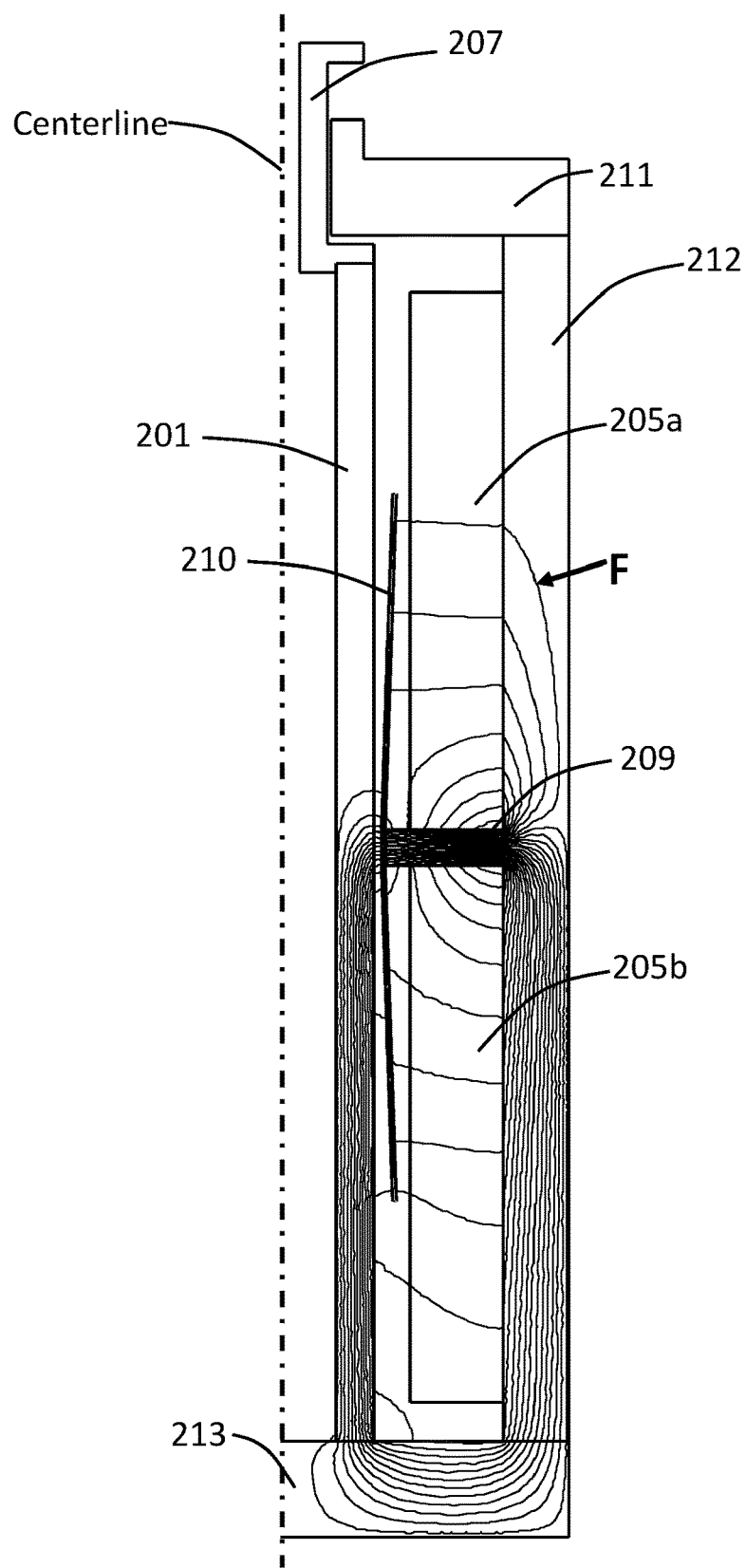
FIG. 10 shows an example of the calculated magnetic flux lines at maximum drive current for an embodiment of the second mode of inventive practice, such as shown by way of example in FIG. 7.

FIG. 10 shows the same axisymmetric magnetic model as FIG. 9 but under condition of maximum rated current flow through drive coils 205a and 205b. In this example, the respective magnetic fluxes from the drive coils 205a and 205b from bias magnet 209 reinforce in the bottom half of magnetostrictive element 201 and cancel in the top half. Thus the bottom half 201B of magnetostrictive element 201 elongates and the top half 201T shortens with respect to the no-drive-current condition moving center support 202 in the upward direction. If the direction of current flow is reversed then the magnetic flux from the drive coils 205a and 205b and from bias magnet 209 will cancel in the bottom half 201B of magnetostrictive element 201 and will reinforce in the top half 201T, thereby moving center support 202 in the downward direction.

Figure 11:
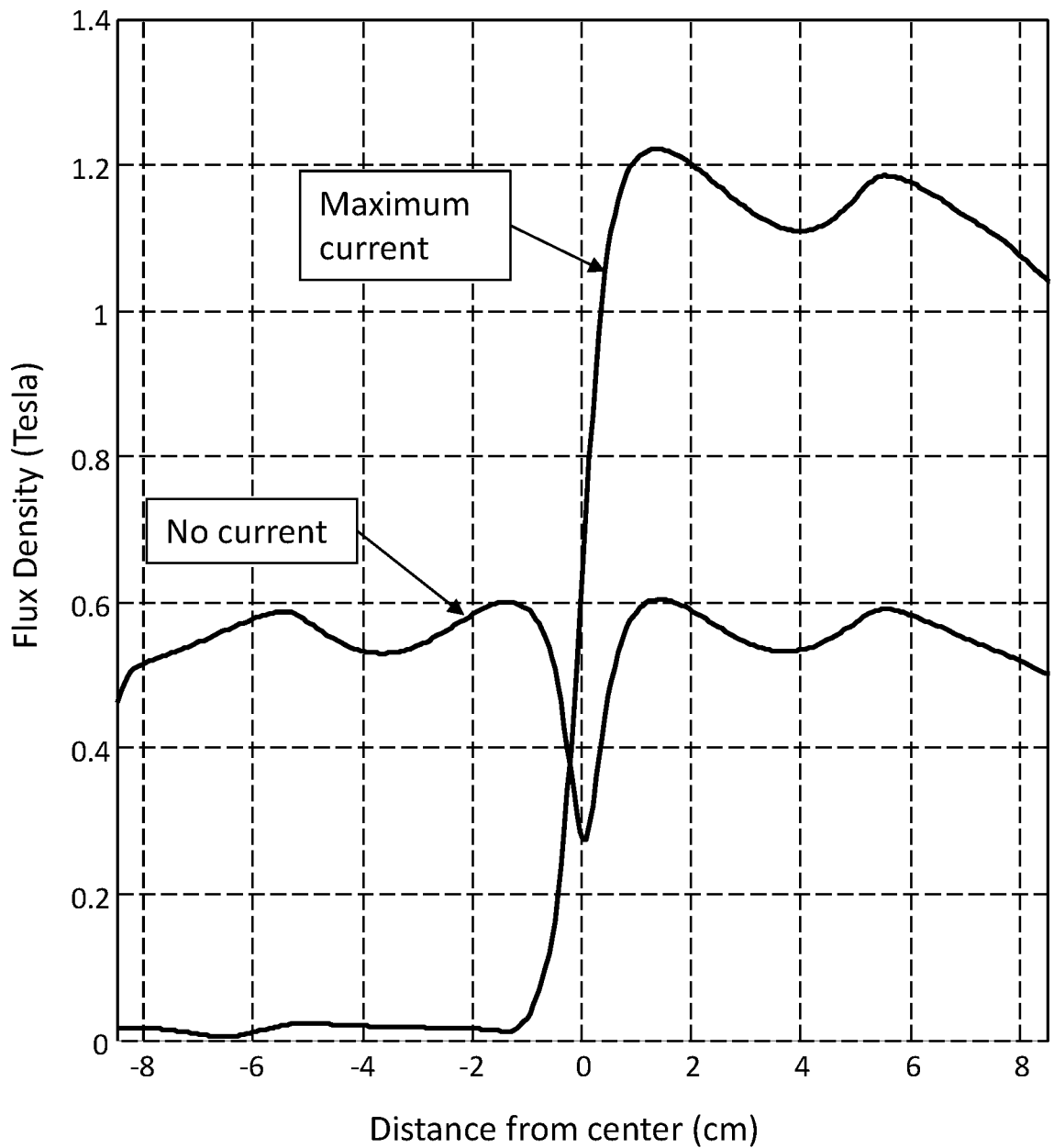
FIG. 11 shows an example of the calculated magnetic flux density for a contour line down the magnetostrictive element at no drive current and at maximum drive current for an embodiment of the second mode of inventive practice, such as shown by way of example in FIG. 7.

FIG. 11 is a plot of the calculated flux density from the FIG. 9 and FIG. 10 examples for an axial contour at a radius half way between the center hole and the outer surface for magnetostrictive element 201. It can be seen that under condition of no current flow through the drive coils 205a and 205b, the bias flux is substantially constant at 0.55 Tesla down the length of the element 201. Under condition of maximum rated current flow the magnetic flux density in the bottom half 201B of magnetostrictive element 101a is nearly zero, while the magnetic flux density in the top half 201T is about 1.05 Tesla. If the direction of current flow were reversed then these flux density values would also reverse.

In practicing many embodiments of the second mode of the present invention, the optimum shape of flux transfer tube 210 may be calculated by a person having ordinary skill in the art who reads the instant disclosure. The ordinarily skilled artisan may perform this calculation using a magnetic model and adjusting geometric parameters until the flux is at the desired level and within acceptable bounds of uniformity. The optimum shape of flux transfer tube 210 depends upon the magnetic permeability of the magnetostrictive material, and is a compromise because the permeability varies with magnetic flux level and stress. For a higher permeability material, such as Galfenol, the optimum tube wall thickness of flux transfer tube 210 is nearly uniform down the length but flares outward with the diameter increasing toward the ends, such as shown in FIG. 7 and FIG. 8. The optimum flare angle is realized when the flux lines in magnetostrictive elements 201 are constant and vertical, such as shown in FIG. 9.

The present invention, which is disclosed herein, is not to be limited by the embodiments described or illustrated herein, which are given by way of example and not of limitation. Other embodiments of the present invention will be apparent to those skilled in the art from a consideration of the instant disclosure, or from practice of the present invention. Various omissions, modifications, and changes to the principles disclosed herein may be made by one skilled in the art without departing from the true scope and spirit of the present invention, which is indicated by the following claims.

What is claimed is:

1. A magnetostrictive actuator comprising a coil component, a magnetostrictive component situated inside said coil component, an output shaft situated inside said magnetostrictive component, and a support member situated inside said coil component and attached to said magnetostrictive component and said output shaft, wherein:
    said coil component, said magnetostrictive component, said output shaft, and said support member are each at least substantially cylindrical and are characterized by the same geometric longitudinal axis;
    said coil component is capable of carrying current and of producing a fluctuating magnetic field in said magnetostrictive component that is proportional to said current carried by said coil component;
    said magnetostrictive component magnetostrictively changes in shape in accordance with said fluctuating magnetic field;
    said support member and hence said output shaft move in an axial direction in accordance with said magnetostrictive changing in shape of said magnetostrictive component;
    wherein said magnetostrictive component includes two magnetostrictive elements each characterized by said geometric longitudinal axis;
    wherein said support member is situated between said two magnetostrictive elements.

2. The magnetostrictive actuator of claim 1, wherein said magnetostrictive change in shape of said magnetostrictive component in accordance with said fluctuating magnetic field includes:
    an increase in axial length of a first said magnetostrictive element; and
    a decrease in axial length of a second said magnetostrictive element.

3. A magnetostriction-based actuation device characterized by a geometric longitudinal axis, the magnetostriction-based actuation device comprising:
    a shaft;
    a first magnetostrictive element, said first magnetostrictive element being at least substantially cylindrical and encompassing said shaft;
    a second magnetostrictive element, said second magnetostrictive cylinder being at least substantially cylindrical and encompassing said shaft, said second magnetostrictive cylinder axially aligned with said first magnetostrictive cylinder;
    a first coil, said first coil encompassing said first magnetostrictive element;

a second coil, said second coil encompassing said second magnetostrictive element, said second coil axially aligned with said first coil;

a support member, said support member placed axially between and coupling said first magnetostrictive element and said second magnetostrictive element, said support member attached to said shaft at an axial end of said shaft;

a magnet ring, said magnet ring placed axially between and coupling said first coil and said second coil;

a flux transfer tube, said flux transfer tube encompassing said first magnetostrictive element, said second magnetostrictive element, and said support member, said flux transfer tube encompassed by said first coil, said second coil and said magnet ring, said flux transfer tube contacting said magnet ring;

wherein said shaft, said first magnetostrictive element, said second magnetostrictive element, said first coil, said second coil, said support member, said magnet ring, and said flux transfer tube are coaxially arranged with respect to said axis;

wherein in accordance with a fluctuating magnetic field produced by current carried by said first coil and said second coil, one of said first magnetostrictive element and said second magnetostrictive element increases in axial length, and the other of said first magnetostrictive element said second magnetostrictive element decreases in axial length;

wherein in accordance with said increasing and decreasing in axial length of said first magnetostrictive element and said second magnetostrictive cylinder, said shaft moves in either of two axial directions;

wherein the combination including said magnetic ring and said flux transfer tube produces an at least substantially uniform magnetic bias along said axis.

4. The magnetostriction-based actuation device of claim 3, further comprising an exterior case and a spring, said spring being associated with said exterior case and providing a compressive preload in an axial direction with respect to said shaft.

5. The magnetostriction-based actuation device of claim 3, wherein said flux transfer tube is cylindrical having a tube wall, a tube axial middle and two tube axial ends, said tube wall being thick at said tube axial middle and attaching to said bias magnet ring at said tube axial middle, the thickness of said tube wall decreasing toward said two tube axial ends to form a tapered outer surface of said tube wall.

6. The magnetostriction-based actuation device of claim 5, further comprising an exterior case and a spring, said spring being associated with said exterior case and providing a compressive preload in an axial direction with respect to said shaft.

* * * * *